US005382896A

United States Patent [19]

Schueller et al.

[11] Patent Number: 5,382,896

[45] Date of Patent: Jan. 17, 1995

[54] MEASURING ASSEMBLY WITH CURRENT SENSOR AND SUPPLY TRANSFORMER

[75] Inventors: Pierre Schueller, Grenoble; Pierre Laffont, Sassenage; Pascal Houbre, St. Martin d'heres, all of France

[73] Assignee: Merlin Gerin, France

[21] Appl. No.: 27,099

[22] Filed: Mar. 5, 1993

[30] Foreign Application Priority Data

Mar. 19, 1992 [FR] France ................................ 92 03435

[51] Int. Cl.⁶ ................................................ G01R 1/04

[52] U.S. Cl. .................................... 324/127; 324/126

[58] Field of Search ............... 324/122, 126, 127, 128, 324/129, 130

[56] References Cited

U.S. PATENT DOCUMENTS

| | | | |
|---|---|---|---|
| 4,059,798 | 11/1977 | Dieckier et al. | 324/127 |
| 4,140,961 | 2/1979 | Akamatsu | 324/126 |
| 4,262,209 | 4/1981 | Berner . | |
| 4,540,939 | 9/1985 | Osborne | 324/127 |

FOREIGN PATENT DOCUMENTS

| | | |
|---|---|---|
| 2255603 | 7/1975 | France . |
| 734768 | 10/1983 | France . |
| 2599195 | 11/1987 | France . |
| 1638625 | 9/1971 | Germany . |
| 2711193 | 9/1978 | Germany . |
| 427948 | 5/1935 | United Kingdom . |

*Primary Examiner*—Kenneth A. Wieder
*Assistant Examiner*—Barry C. Bowser
*Attorney, Agent, or Firm*—Parkhurst, Wendel & Rossi

[57] ABSTRACT

A measuring assembly is formed by association of a current sensor with non-magnetic toroid and a supply transformer with magnetic circuit arranged around the toroid. The first secondary winding of the current sensor is located nearer the primary conductor than the second secondary winding of the supply transformer.

5 Claims, 2 Drawing Sheets

MEASURING ASSEMBLY WITH CURRENT SENSOR AND SUPPLY TRANSFORMER

BACKGROUND OF THE INVENTION

The invention relates to a measuring assembly formed by association of a current sensor with non-magnetic toroid having a first secondary winding designed to deliver a measuring signal. proportional to the derivative of the current flowing in a common primary conductor passing through an orifice, and a supply transformer comprising a magnetic circuit made of ferromagnetic material, and bearing a second secondary winding designed to supply a power supply, notably to the electronic trip device of an electrical circuit breaker.

A device of this kind is known from the document FR-A-2,599,195 filed by the applicant, in which the Rogowski toroid current sensor, and the supply transformer are arranged side by side and coaxially around the primary conductor bar. As the space set aside for the trip device in a circuit breaker case is becoming smaller and smaller, a side by side arrangement of the sensor and transformer becomes unsuitable.

The object of the invention is to reduce the size of a measuring assembly for a system-powered trip device.

SUMMARY OF THE INVENTION

The measuring assembly is characterized in that the current sensor is located inside the magnetic circuit of the supply transformer with a coaxial arrangement around the orifice, and that the first secondary winding is located nearer to the primary conductor than the second secondary winding, which is located in a low magnetic field zone.

This arrangement of the current sensor enables a maximum measuring signal to be obtained at the terminals of the first secondary winding, whereas the second secondary winding is arranged to limit the secondary current of the supply transformer in the event of a short-circuit occurring in the primary conductor.

The magnetic circuit is arranged as a closed frame having a straight branch supporting the second secondary winding, which extends orthogonally to the orifice for passage of the primary conductor. The magnetic circuit comprises, opposite from the straight branch, a part in the shape of an arch, whose internal wall is close to the current sensor.

Protection of the assembly is provided by an insulating enclosure formed by assembly of two half-shells coming into abutment in the mid-plane of symmetry.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
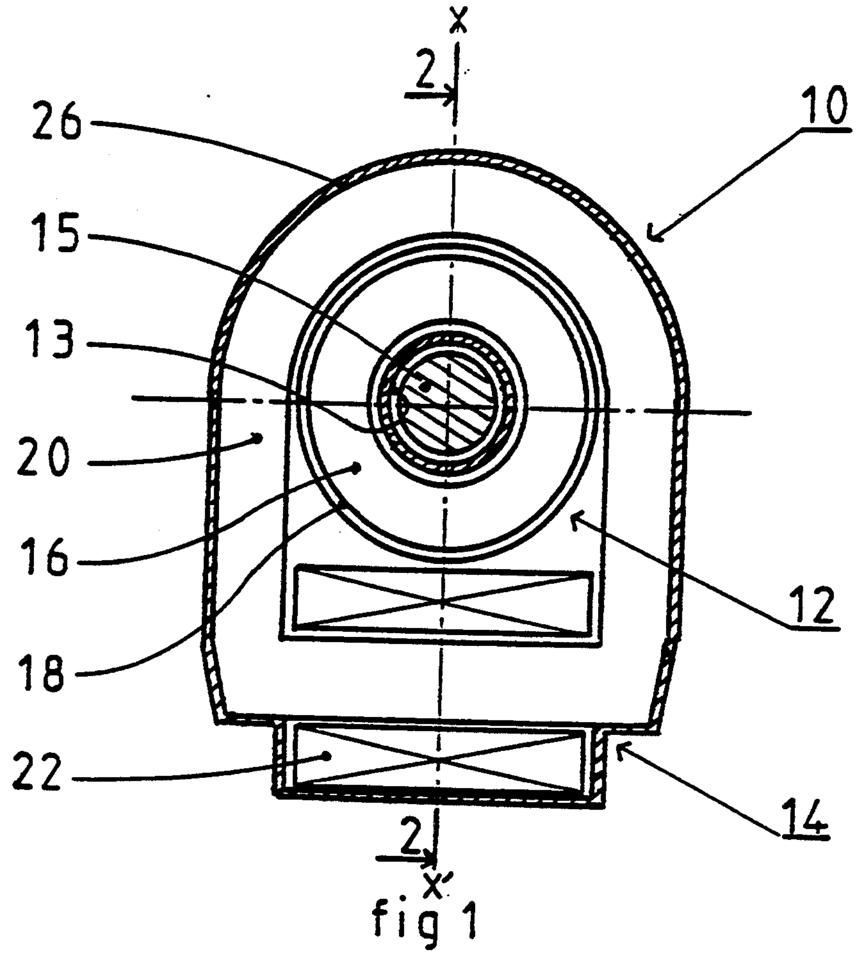
FIG. 1 is an elevational view of the measuring assembly according to the invention.
Figure 2:
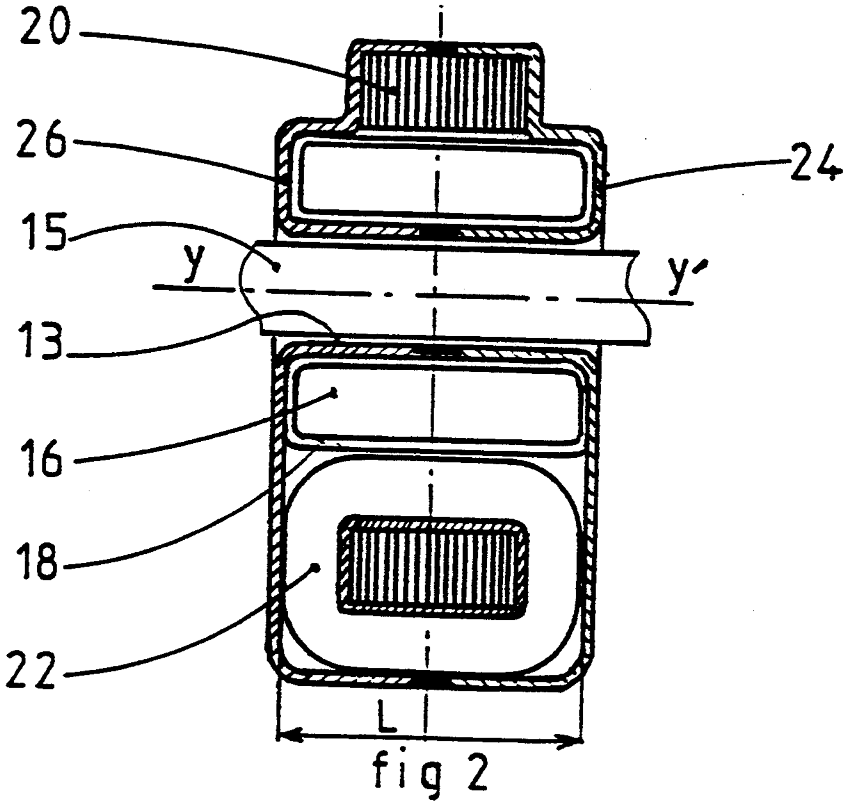
FIG. 2 shows a cross-sectional view along the line 2—2 of FIG. 1.

In FIGS. 1 and 2, the measuring assembly 10 is formed by association of a current sensor 12 and a supply transformer 14, arranged around an orifice 13 designed for a primary conductor 15 to pass through it. This conductor is common to the sensor 12 and transformer 14, and is formed by a phase conductor of an electrical switchgear unit with electronic trip device (not represented). The current sensor 12 of the assembly 10 comprises a closed non-magnetic toroid 16 of the Rogowski type, on which a first secondary winding 18 is coiled, designed to deliver a measuring signal to a processing circuit (not represented) of the trip device. The low power measuring signal is proportional to the derivative of the current flowing in the primary conductor 15.

The adjacent supply transformer 14 comprises a magnetic circuit 20 made of ferromagnetic material, and a second secondary winding 22 designed to apply the supply voltage to the electronic trip device. The magnetic circuit 20 is formed by a closed frame having at its base a straight branch on which the second secondary winding 22 is coiled extending orthogonally to the circular orifice 13. The frame is formed by two stacks of magnetic sheets assembled symmetrically with respect to the mid-plane of trace symmetry xx'. The arched upper part of the frame has a semi-circular shape appreciably centered on the axis yy' of the orifice 13. The assembly 10 is protected by the assembly of two half-shells 24, 26 made of molded insulating material, designed to provide insulation from the surrounding environment. The half-shells 24, 26 come into abutment in the mid-plane of symmetry.

The first secondary winding 18 of the sensor 12 is formed by a succession of joined spirals arranged over the whole periphery of the non-magnetic toroid 16. The coiled toroid 16 is placed inside the magnetic circuit 20 of the transformer 14 with a coaxial arrangement around the orifice 13 for passsage of the primary conductor 15.

The assembly formed by the toroid 16 and first secondary winding 18 extends orthogonally to the second secondary winding 22 following exactly the contours of the arched upper part of the magnetic circuit 20. The non-magnetic toroid 16 of the current sensor 12 surrounds the primary conductor 15 directly to obtain, at the terminals of the first secondary winding 18, a maximum measuring signal in terms of a predetermined primary current. The width L of the Rogowski toroid 16 measured along the axis yy' corresponds appreciably to the size of the second secondary winding 22 measured along this axis yy'.

The second secondary winding 22 of the supply transformer 14 is further from the primary conductor 15 than the toroid 16 and is located in a low magnetic field zone. This results in a limitation of the current intensity supplied by the winding 22 in the event of a short-circuit current occurring in the primary conductor 15.

Figure 3:
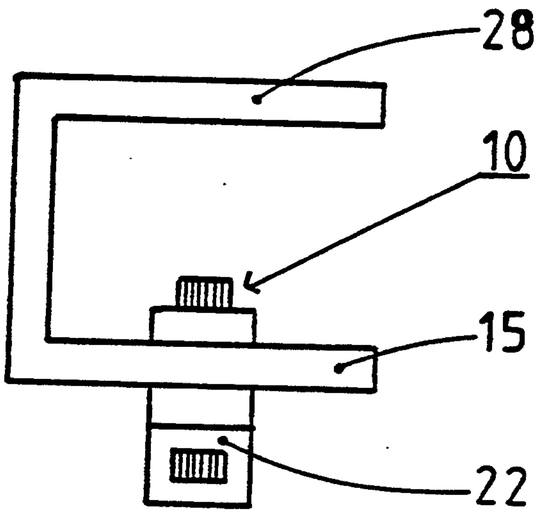
FIG. 3 represents an installation mode of the measuring assembly on a looped primary conductor.

In FIG. 3, the primary conductor 15 is shaped as a loop 28, with the second secondary winding 22 arranged outside the loop.

Figure 4:
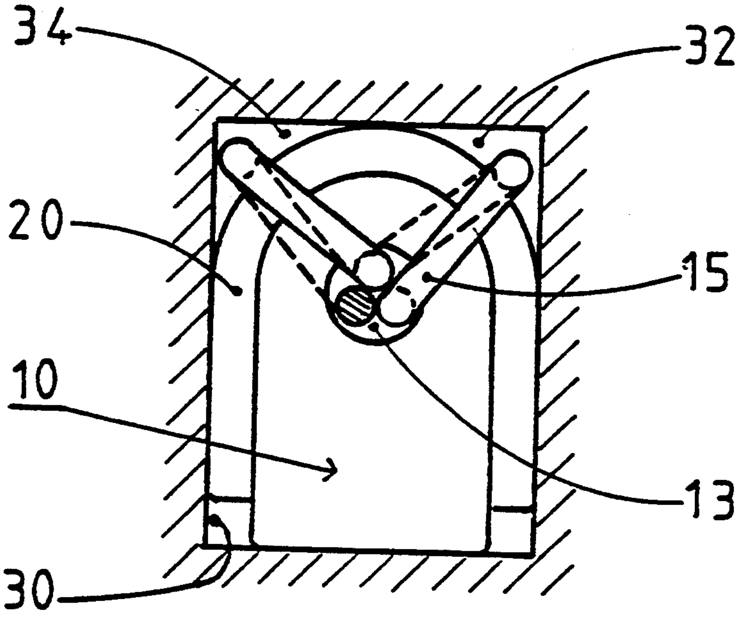
FIG. 4 shows the assembly inserted in a compartment of the circuit breaker case.

Referring to FIG. 4, the measuring assembly 10 is inserted in a parallelepipedic compartment 30 of an insulating case of the electrical switchgear. The arched upper part of the magnetic circuit 20 leaves two free volumes 32, 34 in the corners of the compartment enabling coiling for several passages of the primary conductor 15 in the orifice 13. The cross-section of the primary conductor 15 corresponds to ratings lower than 100 Amperes.

The overall space occupied by the measuring assembly 10 in an insulating case of a switchgear device, notably a circuit breaker with system-powered electronic trip device, is reduced to a minimum.

We claim:

1. A measuring assembly for an electronic trip device, said assembly comprising:
   - a common primary conductor passing through an orifice of the assembly;
   - a current sensor comprising a closed non-magnetic toroid, of Rogowski type, through which said primary conductor passes, and a first secondary winding for delivering a measuring signal that is proportional to the derivative of the current flowing in said primary conductor;
   - a supply transformer comprising a magnetic circuit made of ferromagnetic material, and formed by a closed frame, surrounding said current sensor, and a second secondary winding wound upon said magnetic circuit in a low magnetic field zone for applying a power supply voltage to said trip device;
   - wherein the current sensor is arranged inside said magnetic circuit, and coaxially around said orifice, and wherein the first secondary winding of the current sensor is located nearer to the primary conductor than a second secondary winding of the supply transformer, said primary conductor being common to both said current sensor and said supply transformer.

2. The measuring assembly according to claim 1, wherein closed frame of the magnetic circuit comprises:
   - a straight branch supporting said second secondary winding, which extends orthogonally to said orifice of the primary conductor; and
   - an arched portion arranged opposite from the straight branch, and having an internal wall close to the current sensor.

3. The measuring assembly according to claim 2, wherein the arched part of the magnetic circuit has a semi-circular shape centered on the axis of the orifice, and the width of the toroid along said axis corresponds appreciably to the size of the second secondary winding measured along said axis.

4. The measuring assembly according to claim 1, wherein protection of the assembly is provided by an insulating enclosure formed by assembly of two half-shells coming into abutment in a mid-plane of symmetry.

5. The measuring assembly according to claim 1, wherein the magnetic circuit of the supply transformer comprises a pair of stacks of magnetic sheets, assembled symmetrically with respect to the mid-plane of symmetry.

* * * * *